(12) United States Patent
Ozawa et al.

(10) Patent No.: US 7,473,494 B2
(45) Date of Patent: Jan. 6, 2009

(54) EXPOSURE MASK AND MASK PATTERN PRODUCTION METHOD

(75) Inventors: Ken Ozawa, Kanagawa (JP); Kazuharu Inoue, Kanagawa (JP)

(73) Assignee: Sony Corporation, Tokuo (JP)

( * ) Notice: Subject to any disclaimer, the term of this patent is extended or adjusted under 35 U.S.C. 154(b) by 678 days.

(21) Appl. No.: 10/898,809

(22) Filed: Jul. 26, 2004

(65) Prior Publication Data

US 2005/0026050 A1 Feb. 3, 2005

(30) Foreign Application Priority Data

Jul. 29, 2003 (JP) ............................ P2003-281489
Feb. 13, 2004 (JP) ............................ P2004-036505
Jul. 22, 2004 (JP) ............................ P2004-213777

(51) Int. Cl.
*G03F 9/00* (2006.01)

(52) U.S. Cl. .............................. 430/5; 430/30; 430/311; 430/394; 355/53

(58) Field of Classification Search ..................... 430/5, 430/311, 394, 30; 355/53
See application file for complete search history.

(56) References Cited

U.S. PATENT DOCUMENTS

| | | | |
|---|---|---|---|
| 5,308,741 A | 5/1994 | Kemp | |
| 5,465,220 A | 11/1995 | Haruki et al. | |
| 5,635,285 A | 6/1997 | Bakeman, Jr. et al. | |
| 5,776,639 A | 7/1998 | Umeki et al. | |
| 6,001,512 A | 12/1999 | Tzu et al. | |
| 6,178,035 B1 | 1/2001 | Eda | |
| 6,335,151 B1 | 1/2002 | Ausschmitt et al. | |
| 2001/0028983 A1 | 10/2001 | Kawamura | |
| 2002/0166107 A1 | 11/2002 | Capodicci et al. | |
| 2003/0101421 A1 | 5/2003 | Satoh | |
| 2005/0026050 A1 | 2/2005 | Ozawa et al. | |
| 2005/0130045 A1* | 6/2005 | Ozawa ......................... | 430/5 |

FOREIGN PATENT DOCUMENTS

| | | |
|---|---|---|
| EP | 1 246 010 | 10/2002 |
| JP | 07-230159 | 8/1995 |
| JP | 2001-147515 | 5/2001 |
| JP | 2001-230180 | 8/2001 |
| JP | 2002-099070 | 4/2002 |
| WO | 00/72090 | 11/2000 |

OTHER PUBLICATIONS

European Search Report dated Jul. 27, 2006.
Joseph P. Kirk; Scatterd light in photolithographic lenses; Optical Laser Microlithography VII 2-4; Mar. 1994; San Jose, CA; vol. 2197.
A Bourov et al.; Impact of Flare on CD Variation for 248nm and 193nm Lithography Systems; Proceedings of the SPIE; Bellingham, VA; vol. 4346; Sep. 2001.
European Search Report dated Apr. 16, 2007.

* cited by examiner

*Primary Examiner*—Christopher G Young
(74) *Attorney, Agent, or Firm*—Sonnenschein Nath & Rosenthal LLP

(57) ABSTRACT

An exposure mask in the form of a binary mask for intensity modulating 0th order diffracted light and a mask pattern production method using the exposure mask are disclosed on which a mask production error, an influence of flare of an exposure apparatus and a development characteristic of resist reflect on the design. The exposure mask has a block area in which a plurality of pattern sites in each of which light intercepting patterns for intercepting illumination light emitted from an exposure apparatus and light transmitting patterns for transmitting the illumination light therethrough are formed at an equal ratio and an equal pitch are disposed. The pattern sites which form the block area are disposed such that the pitches of the light intercepting patterns and the light transmitting patterns are equal while the ratio varies gradually.

14 Claims, 18 Drawing Sheets

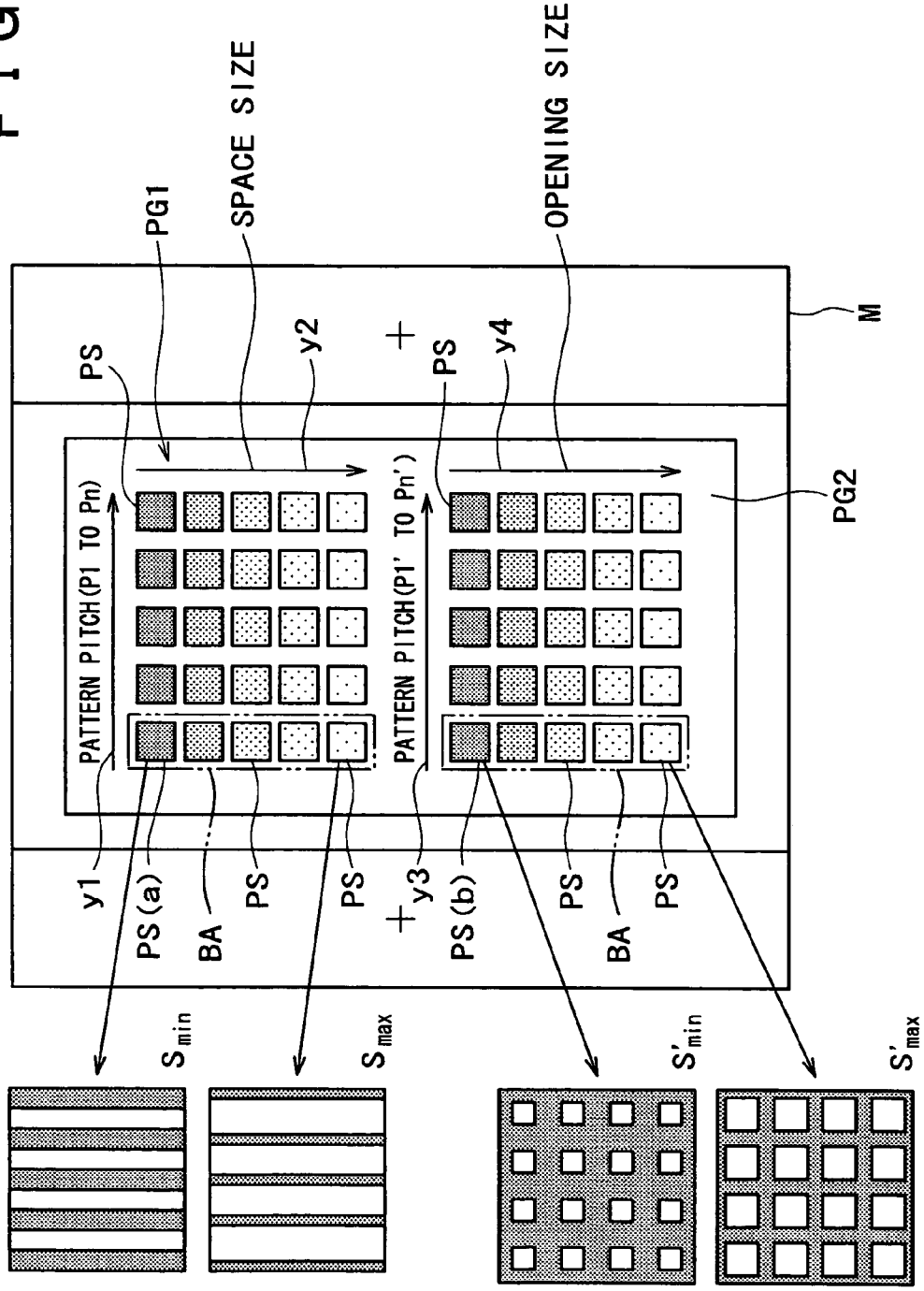

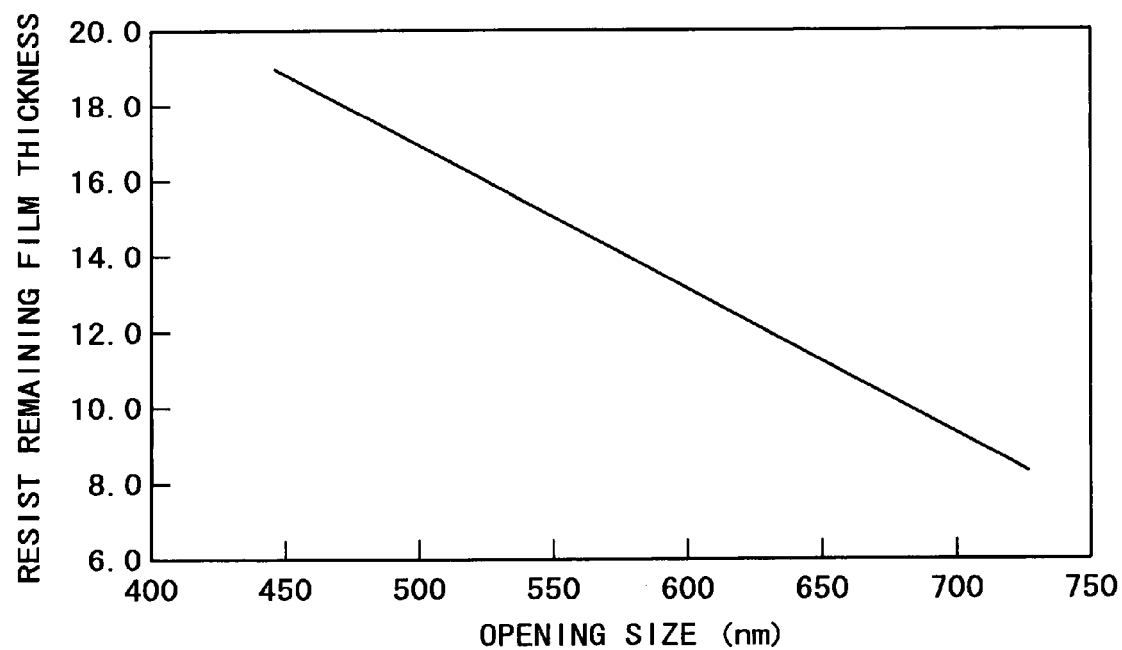
F I G. 1 2

MASK PATTERN

LENS SHAPE

F I G. 1 5
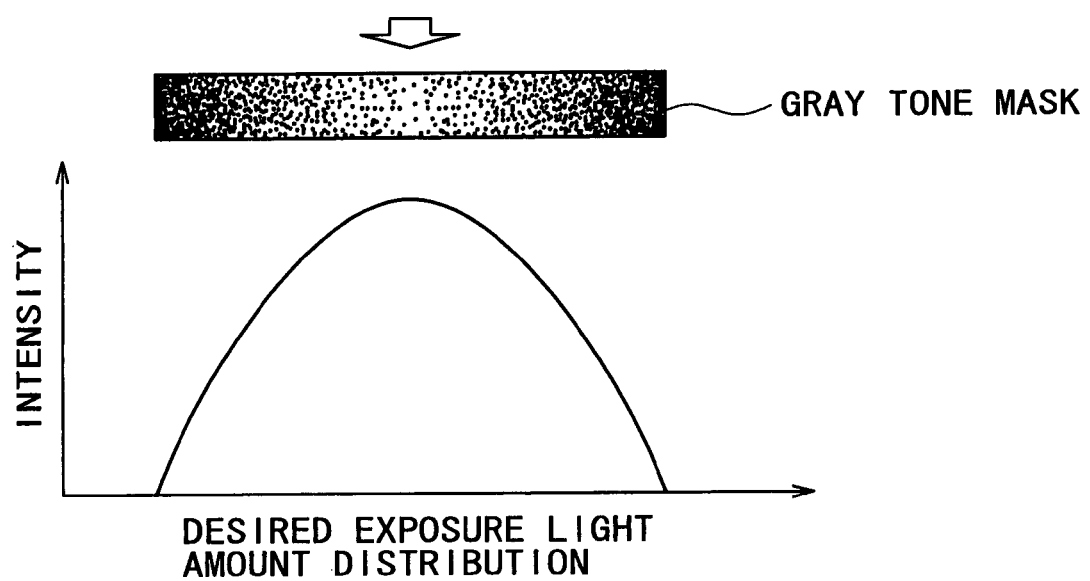

FIG. 16
MASK PATTERN
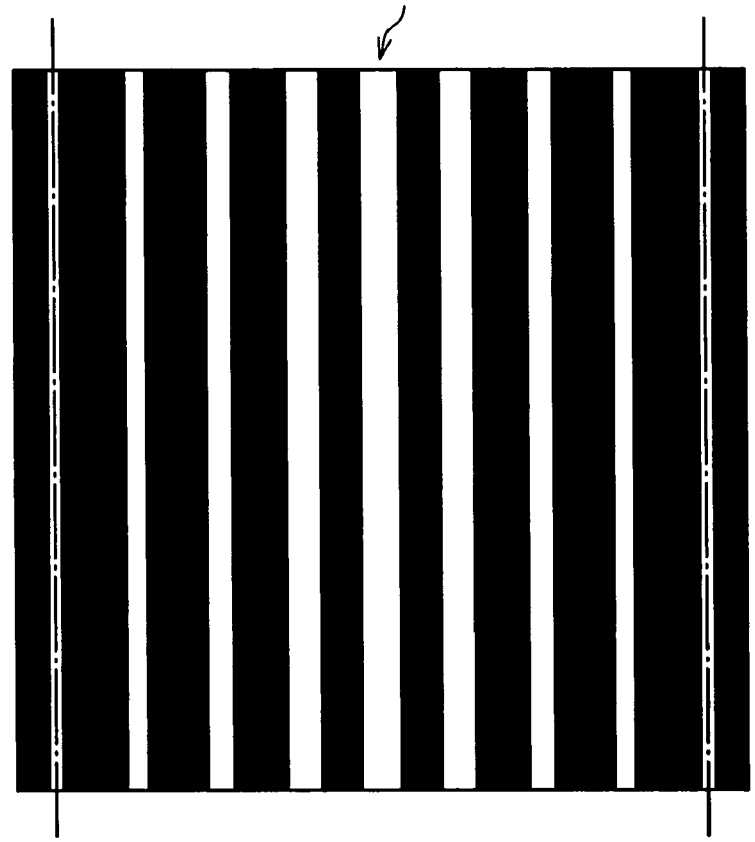
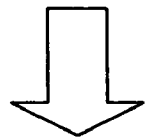
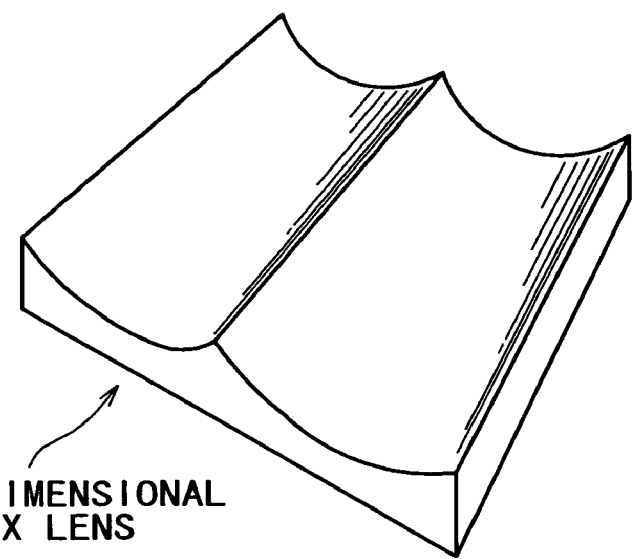
ONE-DIMENSIONAL CONVEX LENS

EXPOSURE MASK AND MASK PATTERN PRODUCTION METHOD

BACKGROUND OF THE INVENTION

This invention relates to an exposure mask and a method of producing a mask pattern used for calibration in formation of a mask pattern to be used for exposure to form a three-dimensional shape of an optical lens array or a like device.

Various methods of producing very small optical parts such as a microlens array used in applied products of image devices such as a CCD (Charge Coupled Device) or LCD (Liquid Crystal Display) unit are available, and one of such methods applies a photolithography technique used in manufacture of semiconductor and liquid crystal devices.

In the method just mentioned, a desired exposure amount distribution is applied to photo-resist which is a photosensitive material, and the photo-resist is developed so that it is worked three-dimensionally. Then, the worked photo-resist is used as a mask to perform etching to three-dimensionally work a silicon, glass or like substrate.

The photo mask used in the lithography process is implemented by such multiple exposure using a plurality of masks as seen in FIG. 14. The exposure method according to this technique is described in connection with one-dimensional exposure. The final exposure light distribution is represented by D(X) in FIG. 14.

First, light of an exposure light amount E[1] is applied to a region <1> using a mask (1) in FIG. 14. Then, light of another exposure light amount E[2] is applied to another region <2> including the region <1> using another mask (2). At this time, the total exposure light amount D1 to the region <1> is E[1]+E[2]. Further, exposure is successively performed with exposure amounts E[3], E[4], . . . , E[n] using further masks (3), (4), . . . (not shown) and (n), respectively. Consequently, the final exposure light amount D[i] to the region i is given by D[i]=E[i]+E[i+1]+ . . . +E[n], and a desired discrete exposure light amount distribution is obtained. In this instance, the number n of masks corresponds to the exposure light amount position resolution, and for example, where n=10, 10 exposure light amount steps are obtained.

Recently, in addition to the multiple exposure method which uses a plurality of masks, another method has been developed wherein a desired exposure light amount distribution is obtained by a single exposure operation using a so-called gray tone mask wherein the transmission factor of a light intercepting film has a continuous distribution as disclosed in Japanese Patent Laid-Open No. 2002-189280 (hereinafter referred to as Patent Document 1). A concept of the gray tone mask is illustrated in FIG. 15.

Of the two methods described above, the former method which utilizes a plurality of masks involves multiple exposure by a plurality of exposure operations multi-stage exposure also in time, and therefore, a resulting integrated exposure light amount distribution includes a remaining stepwise configuration. Further, the number of obtainable exposure light amount gradations is equal to the number of masks and hence to the number of times of exposure operations, and there is a problem that practically the number is approximately ten and a sufficient number of gradations cannot be obtained. Further, the exposure process is complicated and a mask cost which increases in proportion to the number of masks is required, and they give rise to various problems.

On the other hand, the latter method which involves a single exposure operation by a gray tone mask as disclosed in Patent Document 1 is advantageous in that a substantially continuous exposure light amount distribution is obtained. However, generally it is very difficult to produce such a gray tone mask as described above and a special film material and a special mask formation processing technique are required, resulting in a very high mask cost. Further, the special film material provides a matter of concern in regard to a secular change by heat and further provides a matter of concern in regard to the problem of the stability in performance during its use (that is, the stability against heat caused by absorption of light for exposure).

As a countermeasure for the problems described above, the assignee of the present patent application has proposed a method wherein a mask is formed with binary mask patterns of a pitch smaller than a resolution limit pitch and the opening size or dot remaining pattern size is spatially varied to allow formation of an arbitrary three-dimensional structure.

FIG. 16 illustrates a concept of a mask pattern for forming a one-dimensional concave lens array from positive resist in accordance with the method just described. Upon designing such a mask as seen in FIG. 16, the following designing procedure is taken. In particular, the intensity of 0th order light of a single two-dimensional array pattern of a certain pitch (which is smaller than a resolution limit pitch determined from NA, σ and λ as represented by an expression (1) given below) and a certain opening size is theoretically calculated, and an opening size for obtaining a predetermined light amount at a predetermined position is derived based on the calculated strength of 0th order light. Then, the opening size is changed depending upon the place so that a desired thickness of the remaining resist film may be obtained at a predetermined position.

$$P\text{min}=\lambda/\{NA\times(1+\sigma)\} \tag{1}$$

Masks were actually produced as prototypes and photo-resist was formed in a predetermined three-dimensional structure (lens array or the like) on the masks based on the design procedure described above. The three-dimensional structure has some error in formation height as seen, for example, in FIG. 17 or 18.

It can be seen that, as a tendency of the error, the error is great in the formation height at a place at which the opening size is small, that is, at a place at which the mask transmission factor is low. It is considered that, as possible causes, the tendency of the error is caused by (1) an error of the opening size itself (mask production error) and (2) a generation of "fogging exposure" by flare in an exposure apparatus where a great amount of exposure light is provided, resulting in a generation of an exposure light amount like a DC component in all over area of the exposure field.

In particular, FIG. 17 schematically shows the error in the case of (1) above. Referring to FIG. 17, an error arising from the manufacture is produced on a light intercepting pattern size of a mask pattern and has an influence on the exposure light amount to cause an error in the height of the lens.

Meanwhile, FIG. 18 schematically shows the error in the case of (2) above. Referring to FIG. 18, also where it is assumed that a mask pattern has no error (mask error) arising from the manufacture, since the fogging exposure light amount by flare of the exposure apparatus is involved by several percent, the fogging exposure light amount is added to cause an error in the height of the lens to be formed. It is to be noted that, in FIGS. 17 and 18, the solid lines represent design values and the broken lines represent errors.

In addition to the errors described above, the characteristics of the exposure light amount and the remaining resist film height exhibit some difference between designed ones and actual ones because the correlation between the development rates at the surface layer portion and the internal portion of the resist film is somewhat different depending upon whether a three-dimensional structure does not exist (upon designing) or exists (in actual production) in the resist layer at the development step. Consequently, the controllability of the resist remaining film height after the development in the proximity of the resist surface layer is deteriorated.

Therefore, a problem occurs that, if a portion of the resist near the surface is left to form a shape, then an error appears between the height of the remaining film of the resist formed with the set exposure light amount and the height of the actual remaining film and therefore the desired shape cannot be obtained.

Meanwhile, a theoretical model of a development process in which a three-dimensional structure is formed in this manner has not been clarified as yet, and it is difficult to accurately predict a remaining film distribution of resist by a simulation or the like.

SUMMARY OF THE INVENTION

It is an object of the present invention to provide an exposure mask in the form of a binary mask for intensity modulating 0th order diffracted light and a mask pattern production method using the exposure mask wherein a mask production error, an influence of flare of an exposure apparatus and a development characteristic of resist reflect on the design.

In order to attain the object described above, according to an aspect of the present invention, there is provided an exposure mask having a block area in which a plurality of pattern sites in each of which light intercepting patterns for intercepting illumination light emitted from an exposure apparatus and light transmitting patterns for transmitting the illumination light therethrough are formed at an equal ratio and an equal pitch are disposed. The plural pattern sites which form the block area are disposed such that the pitches of the light intercepting patterns and the light transmitting patterns are equal while the ratio varies gradually.

According to another aspect of the present invention, there is provided a method of producing a mask pattern, including the steps of exposing a photosensitive material using an exposure mask having a block area in which a plurality of pattern sites in each of which light intercepting patterns for intercepting illumination light emitted from an exposure apparatus and light transmitting patterns for transmitting the illumination light therethrough are formed at an equal ratio and an equal pitch are disposed as a calibration mask, developing the photosensitive material after the exposure, performing a process as occasion demands for the photosensitive material after the development to form a measurement object and measuring the height of the measurement object corresponding to the block areas, and setting ratios of the light intercepting patterns and the light transmitting patterns for obtaining a desired three-dimensional shape based on measured values of the height of the measurement object and disposing the light intercepting patterns and the light transmitting patterns at the set ratios and pitches on a transparent substrate.

In the exposure mask and the method of producing a mask pattern, the plural pattern sites which form the block area are disposed such that the pitches of the light intercepting patterns and the light transmitting patterns are equal while the ratio varies gradually, the block area can be utilized as a calibration pattern. In particular, by performing exposure of resist which is a photosensitive material using the block area and performing development, a resist remaining film characteristic corresponding to the block area can be grasped. Consequently, a mask pattern wherein pattern dimension errors upon formation of the mask pattern, flare of the exposure apparatus and errors caused by a three-dimensional development characteristic of the resist are canceled can be designed and produced.

In particular, calibration data based on the mask can be obtained as a calibration table or a calibration function of a relationship between the space dimension or hole dimension and the remaining film height at a predetermined pattern pitch which satisfies the non-image formation condition of the expression (1) given hereinabove. Also a mask pattern for actual formation of a lens is produced with the predetermined pattern pitch, and the space dimension or hole dimension at each place is designed using the calibration table or the calibration function.

With the exposure mask and the method of producing a mask pattern, the following advantage can be achieved. In particular, an exposure mask in the form of a binary mask for intensity modulating 0th order diffracted light on which a mask production error, an influence of flare of the exposure apparatus and a resist remaining film characteristic (development characteristic) reflect on the design can be designed, and a three-dimensional structure such as, for example, a lens of a high degree of accuracy can be produced by exposure, development and so forth using the exposure mask obtained in this manner.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1 is a schematic view showing an exposure mask to which the present invention is applied;

FIG. 12 is a diagrammatic view illustrating an example of measurement of a relationship between the size of an opening and the thickness of a remaining film of resist obtained using a calibration mask;

FIG. 15 is a diagrammatic view illustrating a concept of a gray tone mask;

FIG. 16 is a schematic view showing a mask pattern for use for formation of a one-dimensional concave lens;

DESCRIPTION OF THE PREFERRED EMBODIMENT

Figure 2:
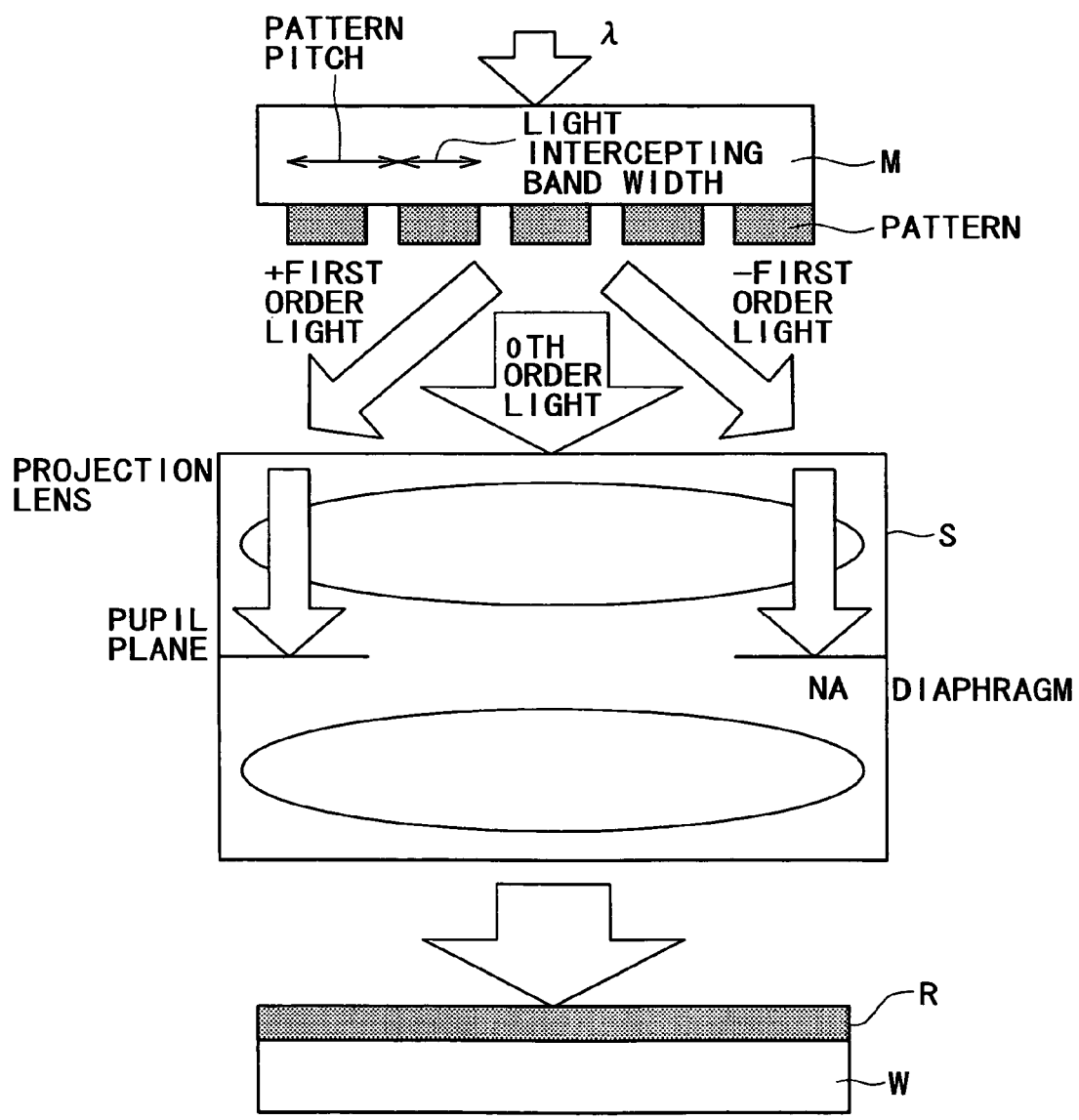
FIG. 2 is a schematic view illustrating a principle of exposure using the exposure mask to which the present invention is applied.

In the following, a preferred embodiment of the present invention is described in detail. FIG. 1 shows an exposure mask to which the present invention is applied, and FIG. 2 illustrates a principle of exposure carried out using the exposure mask (hereinafter simply refer to as "mask") of FIG. 1.

First, the principle of exposure is described with reference to FIG. 2. In an exposure apparatus S to be used for transfer, a pattern surface of a mask M and the surface of a wafer W have a conjugate (image formation) relationship, and usually, an image of a pattern on a lower face of the mask M is formed on the surface of the wafer W to transfer the pattern.

However, where a mask pattern pitch P which defines an exposure light wavelength λ, a numerical aperture NA of the exposure apparatus and a coherence factor σ representative of the size of a second-order light source are given, the minimum pitch Pmin which allows formation of an image on the surface of the wafer W is represented by the expression (1) given hereinabove.

This expression (1) is interpreted on such a level that diffracted light of the lowest order number (±1) is intercepted/not intercepted by the NA diaphragm of the projection lens, and for example, where λ=365 nm, NA=0.5 and σ=0.5, Pmin=487 nm. In particular, since no diffracted lights of a small pitch pattern of less than the minimum pitch Pmin reach the surface of the wafer W, interference between the refracted lights, that is, formation of an image of the mask pattern, does not occur. However, the 0th order light reaches the wafer W.

At this time, where the pitch is equal, the intensity of the 0th order light decreases as the light intercepting band width increases, but where the dimension of the light intercepting portion is equal, the intensity of the 0th order light increases as the pitch increases where the pitch is smaller than the minimum pitch Pmin. In other words, the intensity of the 0th order light can be modulated without allowing formation of an image of a shape of the mask pattern.

More particularly, in a one-dimensional line-and-space pattern, where the transparent portion area ratio in a unit repetition pattern is represented by R (<1), if the intensity of light coming to the surface of the wafer is normalized with the intensity of light on the mask, then it is given by $R^2$. For example, the 0th order light intensity with a line-and-space pattern of 1:1 is 0.25. Similarly, the 0th order light intensity in the case of a 1:1 two-dimensional square hole array is 0.0625.

The present embodiment is characterized in that such an exposure principle by the mask M is used to design and produce a mask pattern. It is to be noted that a basic mask designing method is disclosed in a preceding Japanese patent application by the assignee of the present patent application such as Japanese Patent Application No. 2003-89710.

In the present embodiment, a g-h-i line lamp or a like lamp which uses a plurality of spectra is used as the light source of the exposure apparatus. This is intended to obtain higher exposure power to reduce the exposure time and achieve deeper working by energy absorption of the plural spectra. In this instance, in order that an image of the mask pattern is not formed, it is sufficient to assume one of the plural spectra which has the shortest wavelength.

In particular, where a g-h-i lamp is used, the spectrum mentioned is defined by the i ray ($\lambda=\lambda_0=365$ nm) ($\lambda_0$ is the shortest spectrum wavelength of the light source which includes the plural spectra). Therefore, the non-image formation pitch Pmin has a value (on the surface of the wafer) determined in accordance with the expression (1) given hereinabove, and a pattern of a pitch smaller than the non-image formation pitch Pmin does not form an image.

In the present embodiment, a test mask (hereinafter referred to as calibration mask) which has pattern pitches smaller than the non-image formation pitch Pmin and has different space dimensions (or line dimensions) for one-dimensional patterns and different hole dimensions (or island dimensions) for two-dimensional patterns is produced in advance, and a resist process for formation of an actual three-dimensional shape (for example, microlenses) and an exposure apparatus are used to carry out exposure of a wafer W to which photo-resist R to be used, for example, on a glass wafer is applied using the calibration mask.

The mask M of the present embodiment shown in FIG. 1 is used as a calibration mask mentioned above. Referring to FIG. 1, the mask M includes a pattern group PG1 which includes spaces (light transmitting patterns) and lines (light intercepting patterns) each formed from a straight line and a pattern group PG2 which includes light transmitting patterns each in the form of a square (through-hole). It is to be noted that the dimensions appearing on FIG. 1 are all represented in equivalents on the wafer.

In the pattern group PG1, a plurality of pattern sites PS in each of which spaces and lines appear alternately and successively at an equal ratio and an equal pitch are disposed in a matrix, and the pitch of patterns in the pattern sites PS successively changes in the direction indicated by an arrow mark y1 in FIG. 1 while the ratio between a space and a line in the pattern sites PS successively changes in the direction indicated by another arrow mark y2 in FIG. 1.

Meanwhile, in the pattern group PG2, a plurality of pattern sites PS in each of which squares appear successively at an equal opening size and an equal pitch are disposed in a matrix, and the pitch of squares in the pattern sites PS successively changes in the direction indicated by an arrow mark y3 in FIG. 1 while the opening size of a square in the pattern sites PS successively changes in the direction indicated by another arrow mark y4 in FIG. 1.

A frame work indicated by an alternate long and two short dashes line in FIG. 1 represents a block area BA which is formed from a plurality of pattern sites PS. It is to be noted here that, while only one block area BA is shown in each of the pattern groups PG1 and PG2, one block area is formed from a group of pattern sites PS which exist along the arrow mark y2 or y4.

In one block area BA, the pitch is equal in all of the pattern sites PS, but in the pattern group PG1, the ratio of patterns (size of spaces) successively changes between pattern sites PS which are successively adjacent each other along the direction of the arrow mark y2 in FIG. 2 while, in the pattern group PG2, the size of an opening successively changes between pattern sites PS which are successively adjacent each other in the direction of the arrow mark y4 in FIG. 1.

In the pattern group PG1, the space dimension and the line dimension are allotted up to respective criteria of stable machining in a mask production process. In particular, the pattern site PS(a) of the pattern group PG1 has a repetition pattern which has a pitch P1, a space dimension Smin and a line dimension P1—Smin. Here, Smin represents a mask production lower limit value of the space dimension.

Further, in the block area BA of the pattern group PG1 indicated by a framework of an alternate long and two short dashes line, pattern sites which are similar to the pattern site PS(a) but have space dimensions successively changing from Smin to Smax (the line dimension is minimum) with the pitch fixed to P1 are provided. Here, Smax represents a mask production upper limit value of the space dimension and is defined by the mask production lower limit value of the line dimension.

On the other hand, in the pattern group PG2, the opening sizes are allotted up to the respective criteria of stable machining. In particular, the pattern site PS(b) of the pattern group PG2 has a repetition pattern which has a pitch P'1 and an opening size S'min. Here, S'min represents a production lower limit value of the hole size similarly to the mask production lower limit value Smin of the space dimension mentioned hereinabove.

Further, in the block area BA of the pattern group PG2 indicated by a framework of an alternative long and two short dashes line, pattern sites which are similar to the pattern site PS(b) but have opening sizes successively changing from S'min to S'max (with the minimum dimension left between holes) with the pitch fixed to P'1 are provided. Here, S'max is defined by the lower limit value of the remaining dimension between holes similarly as in the mask production upper limit value Smax of the space dimension.

Also upon production of the mask M, a tolerance appears in the mask dimensions. Usually, there is a tendency that the tolerance is likely to have a negative value as the space dimension decreases but have a positive value as the space dimension increases (line dimension decreases). In short, the mask transmission factor tolerance has a tendency that it has a negative value as the space decreases but has a positive value as the space increases (line decreases).

Incidentally, the mask tolerance depends substantially uniquely on the mask process and substantially reproduces. Therefore, also in actual mask formation for formation of lenses, the tolerance in dimension reproduces qualitatively and quantitatively.

Accordingly, if the mask M shown in FIG. 1 is used to expose resist or the like to be used to develop the resist, then the height of the remaining film of the resist or the like after the development includes all of results of fogging exposure by flare, the mask dimension tolerance and the resist development characteristic.

In particular, the exposure light amount according to the space size reflects on exposure and development, for example, for the block area BA of the pattern group PG1 indicated by an alternate long and two short dashes line in FIG. 1, and therefore, the resist remaining film height obtained differs depending upon the space size. Similarly, on exposure and development, for example, for the block area BA of the pattern group PG2 indicated by an alternate long and two short dashes line in FIG. 1, the exposure light amount according to the opening size reflects, and therefore, the resist remaining film height obtained differs depending upon the opening size.

Here, where the shape to be formed actually here is one-dimensional cylindrical lenses, it is assumed that also the pattern pitch of the mask for formation of them is formed with the pattern pitch Pi in the pattern group PG1. In other words, it is assumed that the lens size is an integral number of times the pattern pitch Pi.

In short, the lens size to be formed is an integral number of times the pattern pitch Pi of the master pattern as disclosed in the preceding patent application (Japanese Patent Application No. 2003-89710). Similarly, where the shape to be formed is two-dimensional lenses, it is assumed that they are formed with the pattern pitch P'j in the pattern group PG2. In short, the lens size is an integral number of times the pattern pitch P'j.

By measuring the height of the remaining film of resist formed by exposure and development as an object of measurement, a correlation between the space dimension (with the pitch fixed) and the height of the resist remaining film or between the opening size and the height of the resist remaining film can be obtained.

Figure 3:
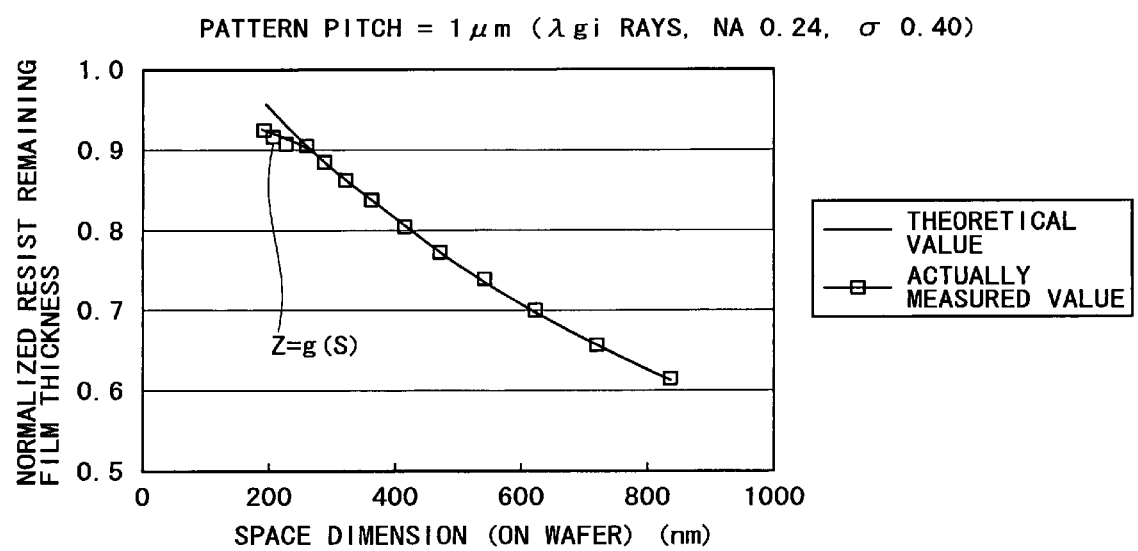
FIG. 3 is a diagram illustrating a relationship between the dimension of spaces and the thickness of a remaining film of resist.

Here, in order to facilitate description, it is assumed that the target shape is a one-dimensional lens array, and the correlation between the space dimension and the thickness of the resist remaining film in this instance is illustrated in FIG. 3. The correlation data between the space dimension and the resist remaining film thickness Z is given by $Z=g(S)$, where S is the space dimension. The resist remaining film thickness $Z=g(S)$ is calculated statistically using a plurality of data based on the same pattern site PS. $g(S)$ may be given in the form of a calibration table or in the form of a calibration function with appropriate approximation or interpolation applied.

In the present embodiment, the resist remaining film thickness $Z=g(S)$ is used to design and produce a mask pattern. Now, designing of a mask pattern based on the resist remaining film thickness $Z=g(S)$ is described. In particular, the space dimension at each place for obtaining a final lens shape $Z=f(X)$ is represented by $S=g-1(f(X))=g-1(f(nP))$ from the correlation data to set the space dimension at each X coordinate. Here, the mask pattern pitch dimension is represented by P, and the X coordinate of the center of each space is represented by $nP$ ($n=0, \pm 1, \pm 2, \pm 3, \ldots$). Further, $g-1( )$ represents an inverse function to $g( )$.

Incidentally, while the foregoing description is based on the presupposition that the size of a structure to be formed (for example, lenses) is an integral number of times the pattern pitch in the calibration mask, actually this condition may not always be satisfied.

In other words, the size of a structure of an object of formation is sometimes different from an integral number of times a pitch disposed in the calibration mask (one-dimensional: P1 to Pn, two-dimensional: P'1 to P'n). The description will be made for such a case.

It is to be noted here that the structure of an object of formation is presumably a one-dimensional lens array and the unit lens element size is 2L. Here, the pattern pitch of a mask for forming the lens array is represented by $P=L/N$. Here, N is an integer, and P is determined so as to satisfy the expression (1) given hereinabove.

The pitch closest to this P in the pattern group PG1 of the calibration mask is represented by $P_k$. First, a function $g(S)$ of $Z=g(S)$ is determined from the remaining film height data group in the pitch $P_k$ group. Here, if the set exposure amount where the pitch is $P_k$ and the space dimension is S as described hereinabove is represented by $E_{set}$, then the exposure light amount actually provided to the wafer is $E_{PK}(S)=E_{set} \times (S/P_k)^2$.

Here, the remaining film height data of the pattern pitch $P_k$ group are approximated or interpolated by a function of the exposure amount $E_{Pk}(S)$. This is represented by $Z=h(E_{Pk}(S))$. Further, since the lens formation pattern pitch to be actually used is P, the exposure amount provided to the wafer when the space dimension is S is given by $E_P(S)=E_{set}*(S/P)^2$.

Therefore, the relationship between the space dimension S and the remaining film height at the mask pattern pitch P is determined indirectly from $Z=h(E_P(S))$. Consequently, even if a pattern pitch for calibration equal to an integral submultiple of the size of the structure to be formed actually is not available, a mask pattern can be designed.

In the present embodiment, resist remaining film height data after exposure and development in which the mask M is used are acquired. This is effective when the conversion-difference of dry etching at a later step is 1:1. In other words, the final working depth dimension=resist depth dimension.

Actually, however, also it is predicted that the etching conversion difference is displaced from 1:1. In this instance, if a sample is produced by dry-etching a substrate such as the wafer W after exposure and development with the present mask M and using the final working depth dimension, then correlation data with not only the mask pattern dimension tolerance, the influence of flare of the exposure machine and the development characteristic described hereinabove but also the etching conversion difference taken into consideration can be obtained as the calibration data. Consequently, improvement in the final plane accuracy can be achieved.

It is to be noted that also it is a possible idea not to use the dry etching method in which resist after development is used but to perform, after formation of a resist shape, electrocasting plating for the resist shape to produce a mold and use the mold for mass production by a stamping method in which a less expensive resin or the like is used as a material. Also in this instance, the present mask M is used to expose and develop resist and then the resist shape is electrocast to produce an object of measurement, and then measurement of the height is performed for the object of measurement to obtain calibration data (correlation data). Where the calibration data obtained are used, the influence of fluctuation of the shape upon electrocasting can be eliminated.

Figure 4:
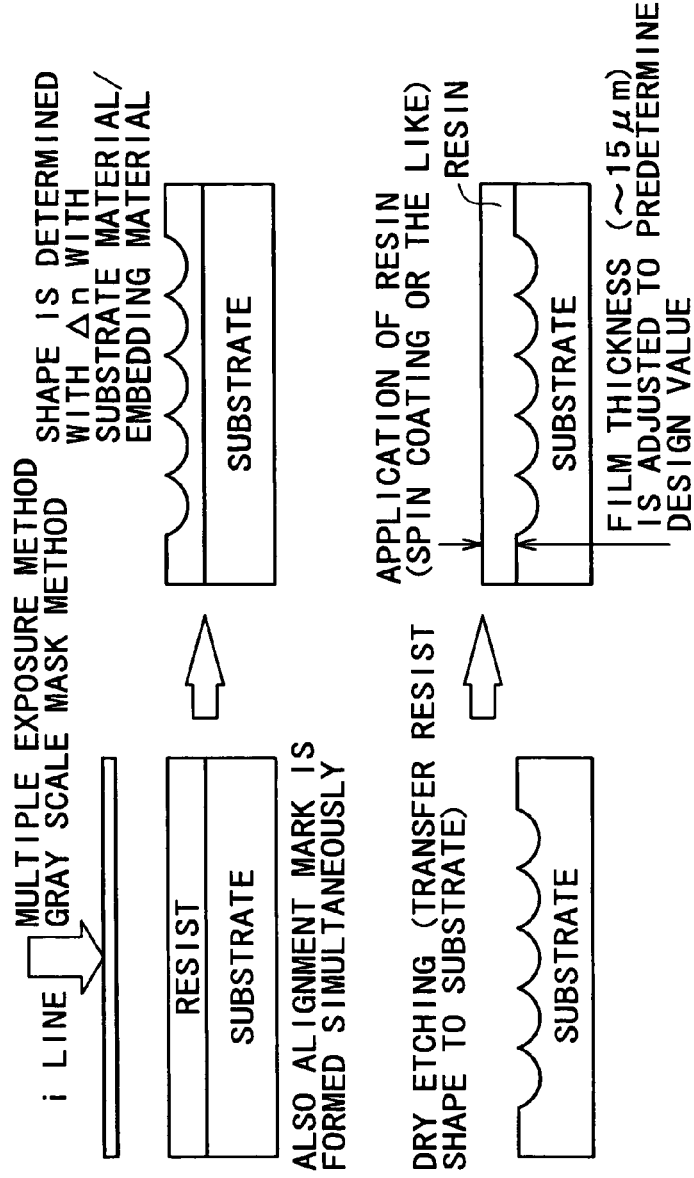
FIGS. 4A to 4C are schematic views illustrating a method of producing a micro lens array.

Here, a method of producing a microlens array using an exposure mask designed and produced based on correlation data acquired using the mask M of the present embodiment is described with reference to FIG. 4. First, photo-resist (hereinafter referred to simply as "resist") of a photosensitive material is applied to a substrate formed from, for example, a quartz glass wafer having a diameter of 6 inches. The thickness of the applied resist is, for example, approximately 10 μm (refer to FIG. 4A).

Then, i line is illuminated from a stepper which is one of exposure apparatus so that the resist is exposed through the mask of the present embodiment. Thereupon, also an alignment mark which is required in a succeeding step is formed simultaneously. After the exposure, the resist is developed to allow the three-dimensional shape set by the mask to be transferred to the resist (refer to FIG. 4B).

Then, the substrate is dry etched through the resist. Consequently, the three-dimensional shape of the resist is transferred to the substrate. Thereafter, a resin material is applied by spin coating or the like on the substrate to which the three-dimensional shape has been transferred. Consequently, a lens array of the resin corresponding to the three-dimensional shape of the substrate is formed (refer to FIG. 4C).

Figure 5:
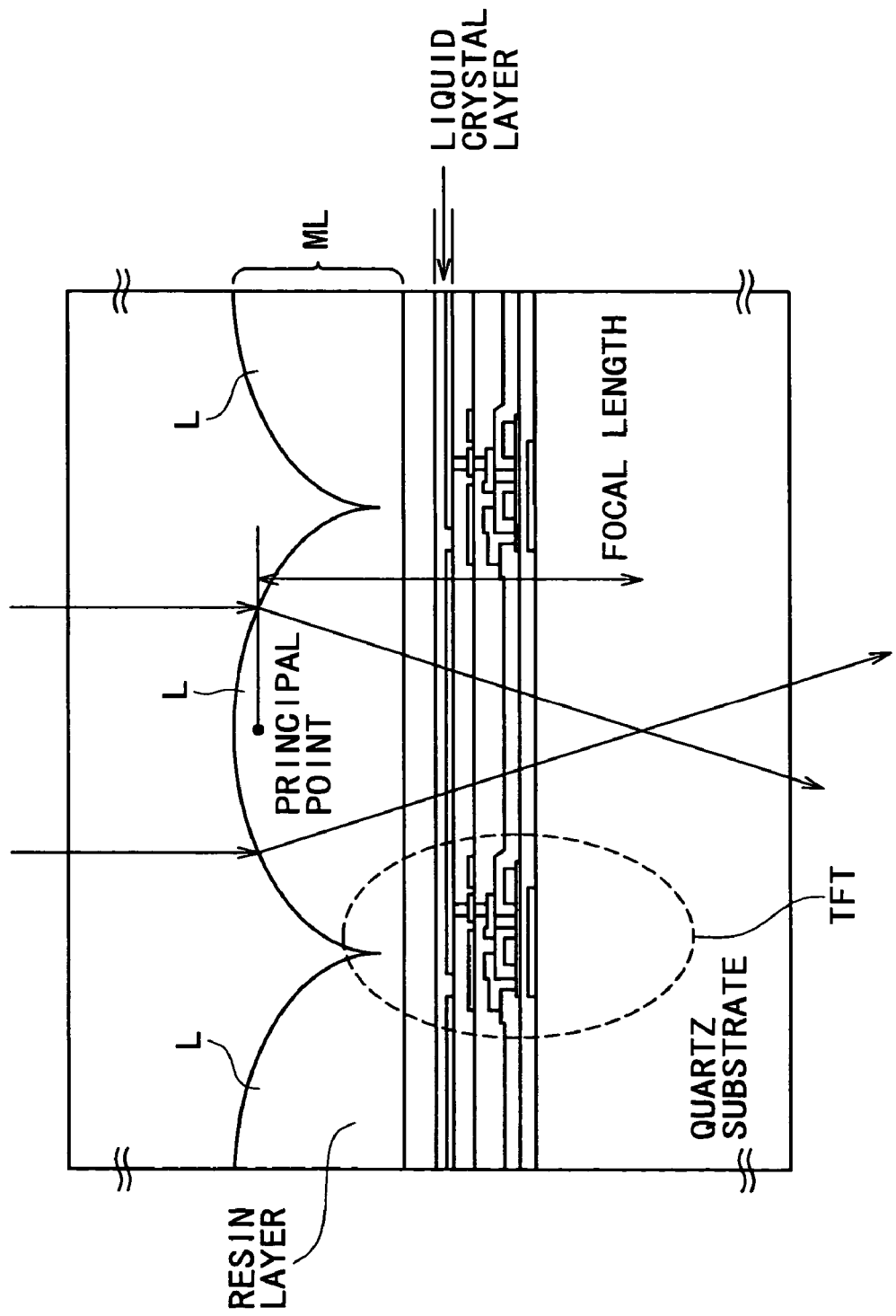
FIG. 5 is a schematic view illustrating an example of an application of the exposure mask to a liquid crystal projector.

Such a microlens array as described above is applied to such an apparatus as shown in FIG. 5. The apparatus shown in FIG. 5 is a liquid crystal projector which includes TFTs (Thin Film Transistors) formed on a quartz substrate and a liquid crystal layer formed on the TFTs. The TFTs are driven to control the orientation of the liquid crystal layer in a unit of a pixel.

The microlens array ML formed using the mask of the present embodiment includes lenses L formed from a resin layer in a corresponding relationship to individual pixels of the liquid crystal projector. With the mask of the present embodiment, the microlens array ML can be formed by a single exposure operation, and since the mask itself is a binary mask including a combination of light intercepting patterns and light transmitting patterns, it can be produced readily. Accordingly, the microlens array ML to be applied to a liquid crystal projector can be provided at a low cost, and reduction of the cost of the liquid crystal projector can be anticipated.

Further, as described hereinabove, also the shape of the lenses L to be formed can be set freely depending upon the ratio and/or the arrangement of the light intercepting patterns and the light transmitting patterns, and an accurate lens shape can be reproduced by applying such a mask design technique as described above in connection with the embodiment. Thus, the lenses L can provided which have a high degree of accuracy without formation of unnecessary joint lines on the boundaries between the individual lenses L.

It is to be noted that, while the method of producing a microlens array described above uses an example wherein a substrate is worked by etching after a three-dimensional photo-resist shape is formed, it is otherwise possible to work photo-resist by electrocasting to produce a mother mold and use the mother mold for mass production using a stamper system.

Figure 6:
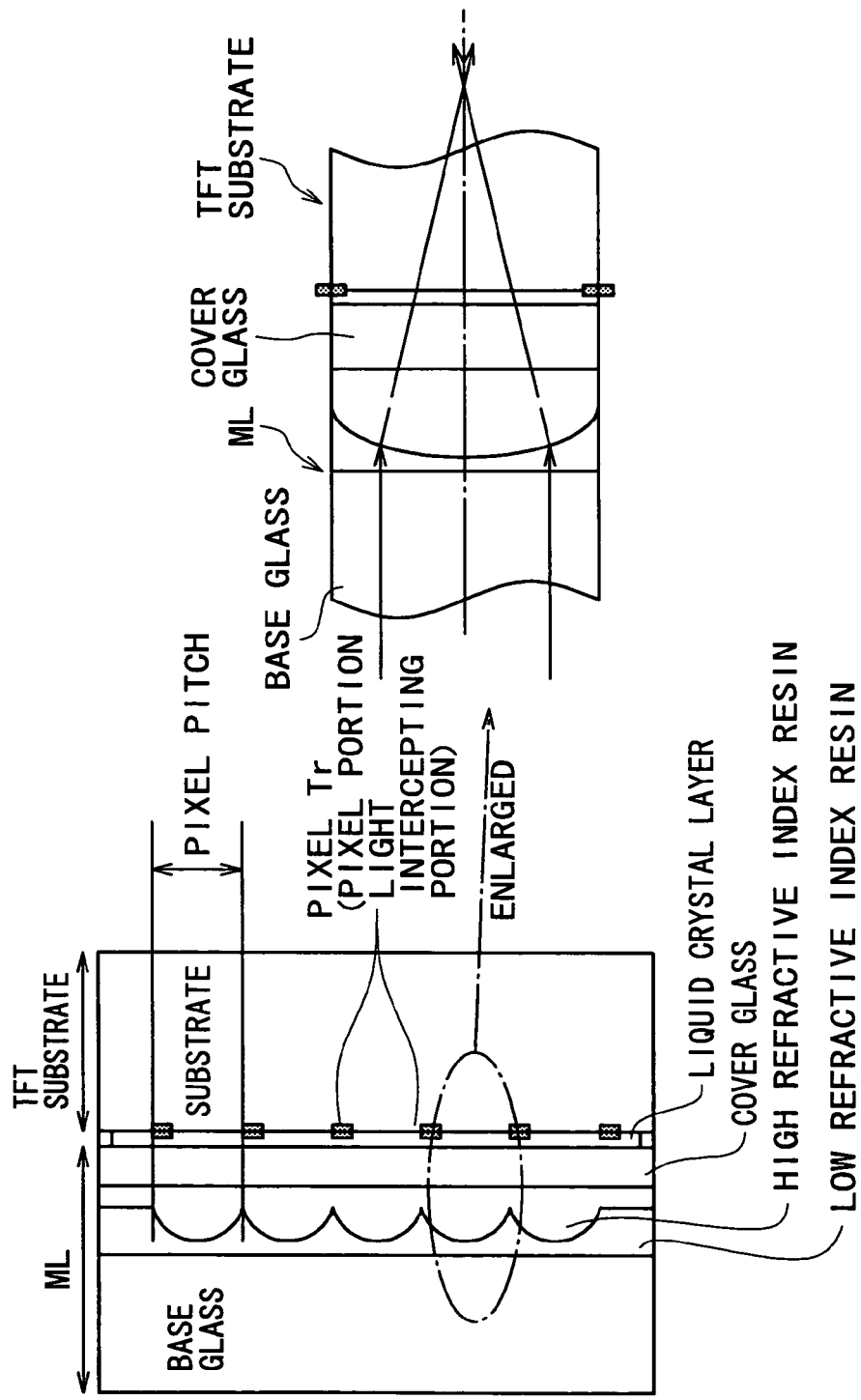
FIG. 6 is a schematic sectional view illustrating an example of an application of the exposure mask to a stamper system.

FIG. 6 shows an example of application to a microlens array of the two-layer type of a resin formed by a stamper system. Referring to FIG. 6, each of lenses of the microlens array ML shown is provided corresponding to a gap between pixels Tr (transistors) of a TFT substrate. In particular, high refractive index resin is applied to a cover glass layer of a TFT substrate and is shaped into a lens shape by a stamper system, and the lenses are covered with low refractive index resin.

Such a lens array as just described can be applied not only to a liquid crystal projector but also to CCD apparatus or like other liquid crystal display apparatus, semiconductor lasers, light receiving elements and optical communication equipments. Further, the method of production of the present embodiment can be applied also to production of three-dimensional shapes other than the lenses.

It is to be noted that, while, in the embodiment described above, the mask M includes two pattern groups including the pattern group PG1 in which each of spaces and lines is formed from a straight line and the pattern group PG2 in which each transmission pattern is formed from a square, the mask M according to the present invention is not limited to this but may include only one of the two pattern groups. Further, as described hereinabove, if each of the pattern groups PG1 and PG2 includes at least one block area BA, then such calibration data necessary for mask pattern design as described above can be obtained.

Figure 7:
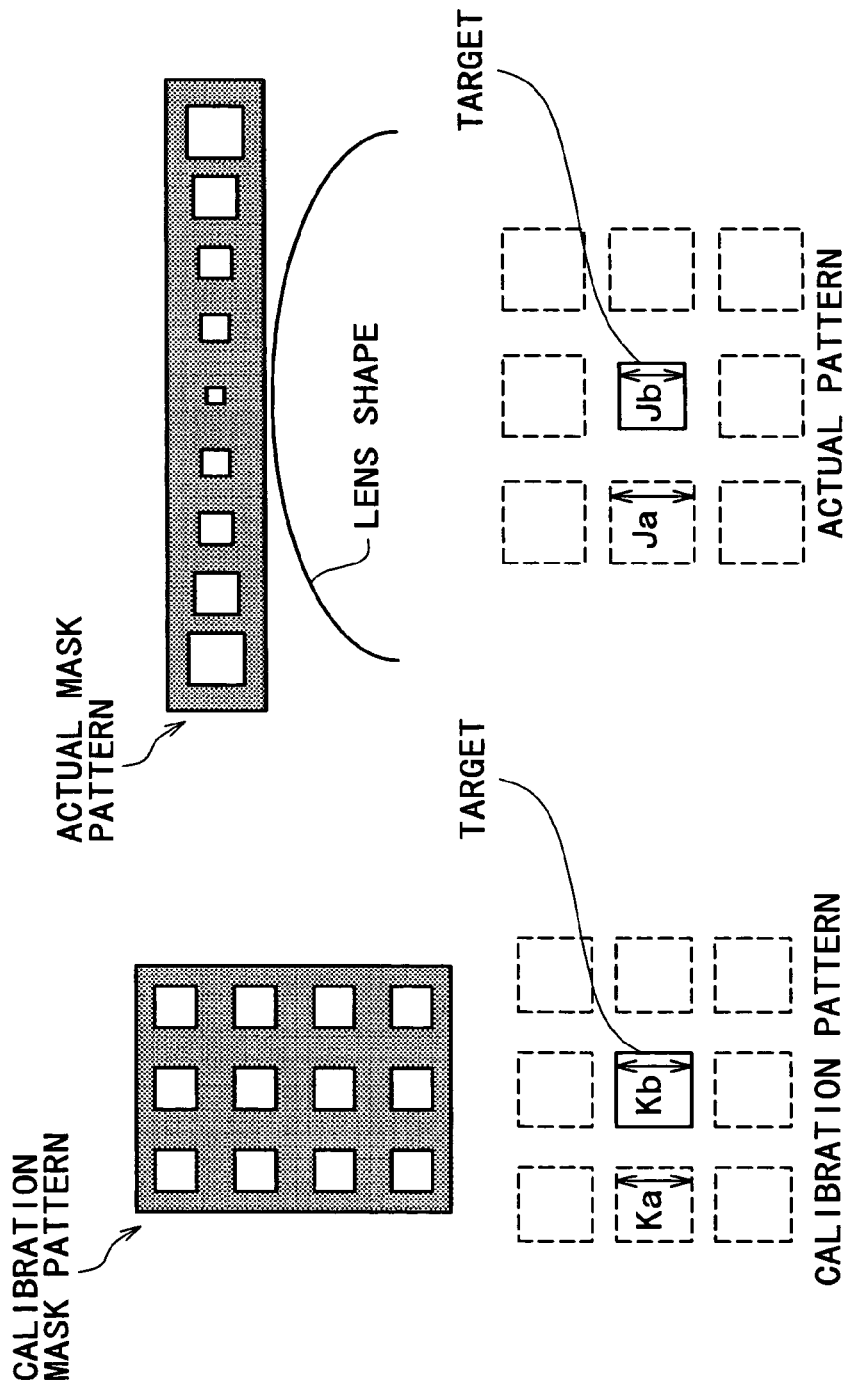
FIGS. 7A and 7B are schematic views illustrating a difference between a calibration mask and an exposure mask.

Now, a method of producing an exposure mask to be used to form an actual mask pattern for lens formation using the calibration mask described above is described.

Where the calibration mask described above is used to produce an exposure mask, such a difference as illustrated in FIGS. 7A and 7B are involved. In particular, the calibration pattern shown in FIG. 7A is a large-area monotone pattern wherein the size Kb of a target opening and the size Ka of an adjacent opening are completely equal to each other. However, in the actual mask pattern for lens formation shown in FIG. 7B, the size Jb of a target opening and the size Ja of an adjacent opening do not necessarily coincide with each other.

Therefore, when the actual pattern is used for exposure, since the influence of rays of light having passed through the adjacent opening on the target opening is different from that in the case of the calibration data, even if the exposure result of the calibration data is used to design mask data, the shape of the worked substrate of the mask after the exposure, development and working are performed for the mask may not possibly coincide with the original design values of the lenses.

Therefore, in the present embodiment, after a mask pattern corresponding to a desired lens shape is formed using the calibration mask, actual exposure is performed to form a lens shape, and the lens shape is measured and errors exhibited by a result of the measurement from the calibration mask are corrected to form a new mask pattern. By this, correction data determined from a relationship in magnitude of adjacent openings appearing on an actual mask pattern different from the calibration pattern can be reflected on the actual mask pattern.

FIGS. 8(a) to 8(e) illustrate correction of a mask pattern. First, exposure and development are performed using a mask pattern for lens formation designed using the calibration mask in advance, and measured values of the shape (lens height) of the lens surface formed by the exposure and development are compared with the designed shape (lens height) of the lens surface.

Figure 8:
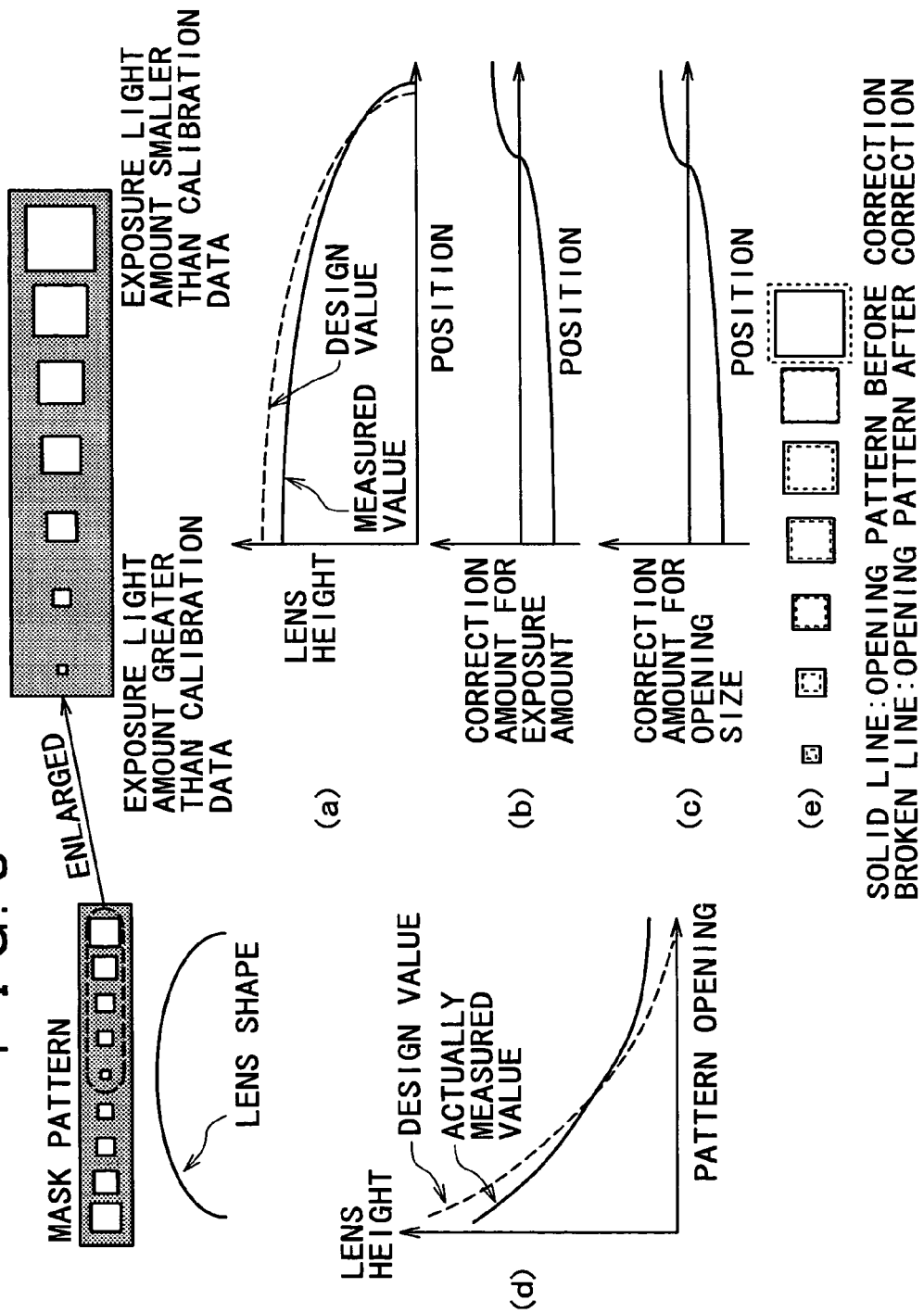
FIG. 8 is a schematic view illustrating correction of a mask pattern.

Since an actual opening is influenced by the exposure light amounts of surrounding patterns, where the opening in the mask designed with actual data is comparatively small, the transmission factor of the opening is greater than a value predicted from the calibration data as seen in FIG. 8(a) because the surrounding opening patterns are greater than the opening pattern. On the other hand, where the opening is comparatively great, the transmission factor thereof is smaller than a value predicted from the calibration data because surround opening patterns are smaller than the opening pattern. Therefore, the completed lens shape is such a shape as given by the measured values of FIG. 8(a).

From the shape of the design values and the shape of the measured values, differences, that is, amounts corresponding to exposure light amount errors and/or opening size correction amounts are determined as seen in FIGS. 8(b) and 8(c). The errors represent corrected heights necessary for the shaped lens. Actually, there is a tendency that the lens height exhibits a lower value than the designed lens height (the exposure light amount increases) by a greater amount as the opening size decreases as seen in FIG. 8(d).

An example of opening patterns on which the errors reflect is shown in FIG. 8(e). A solid line in FIG. 8(e) indicates an opening pattern before correction while a broken line indicates an opening pattern after the correction. As seen from FIG. 8(e), where the opening is small, the correction decreases the size of the opening, but where the opening is great, the correction increases the size of the opening.

Here, the lens height error is represented by $\Delta Z$, and the correlation between the same and the image height (lens radius=r) by $\Delta Z(r)$. Where the original target shape to be formed is represented by $Z(r)$, the target shape for the corrected master is converted into $Z'(r)=Z(r)-\Delta Z(r)$ and a mask pattern is designed in a similar flow of operations to that described hereinabove. In particular, the desired lens shape is corrected by the remaining difference $\Delta Z(r)$ to obtain a target shape of the surface shape, and the master pattern data are produced based on the calibration data. By this, master pattern data for converting the desired lens shape into and producing the target shape after exposure can be obtained.

Figure 9:
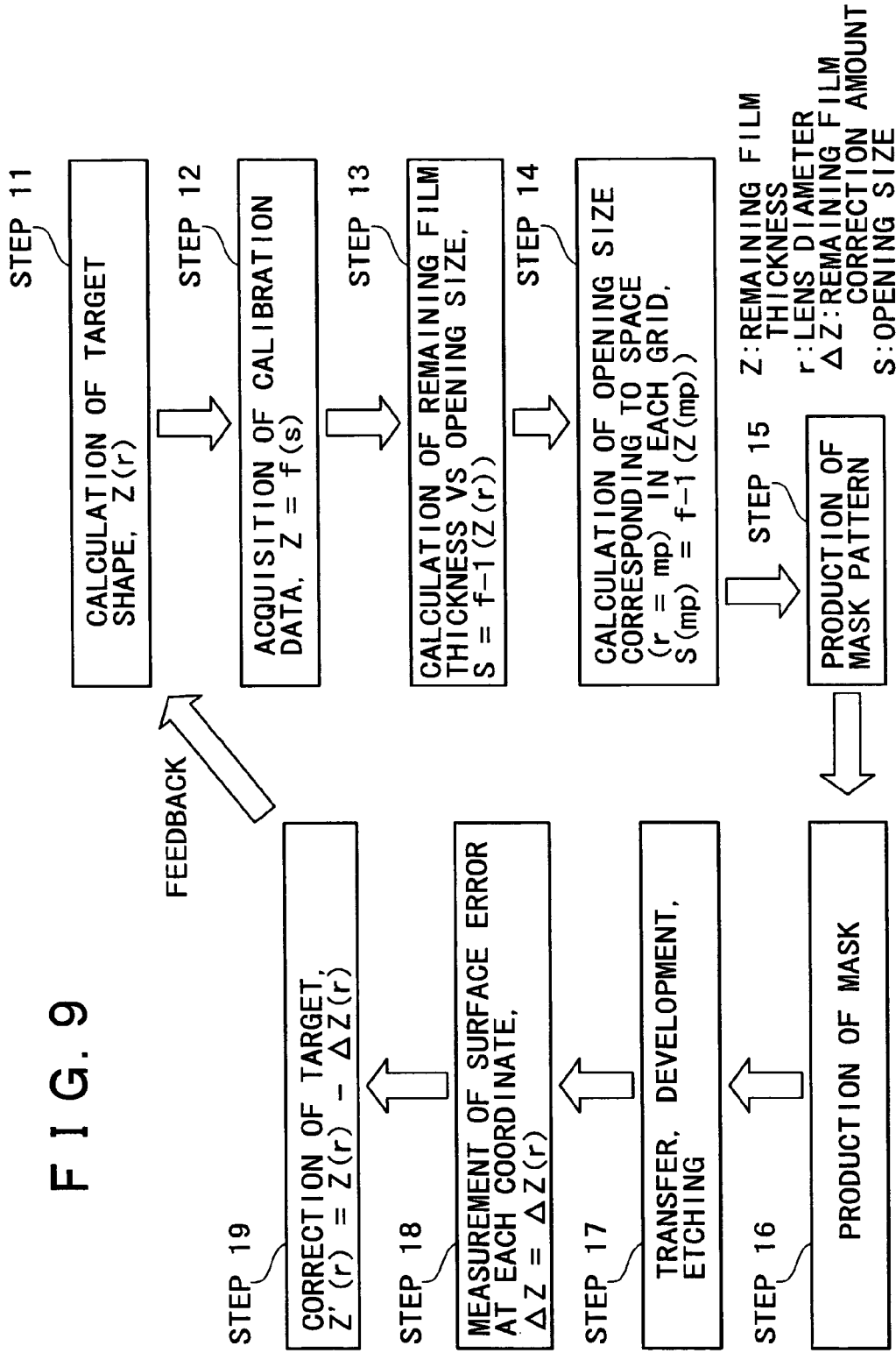
FIG. 9 is a flow chart illustrating a procedure of causing correction by an error to reflect on actual design of a mask pattern.

A procedure of causing the correction for the error described above to reflect on actual mask pattern design is described below with reference to FIG. 9.

Step 11: A target lens shape $Z(r)$ is defined and calculated. Here, the target lens shape is set to the lens height $Z(r)$ where r is the radius.

Step 12: Calibration data is acquired in accordance with an expression $Z=f(s)$. In particular, a relationship between the opening size and the lens height is calculated based on the calibration data. In the expression, s represents the opening size of the calibration data, and f is a function for deriving the lens height from the opening size.

Step 13: The ratio between the remaining film thickness and the opening size is calculated in accordance with an expression $S=f-1(Z(r))$. In particular, a relational expression of the opening size necessary for the height (remaining film thickness) of the lens is determined. In the expression, S is the opening size necessary to produce the desired lens height $Z(r)$ with respect to a certain space dimension (hereinafter referred to as pattern grid).

Step 14: The opening size corresponding to the space (r=mp) of each pattern grid is calculated in accordance with an expression $S(mp)=f-1(Z(mp))$. In the expression, $S(mp)$ is the opening size where the center coordinate of the opening pattern derived from the lens shape is represented by mp. Here, p represents the pattern pitch, and m a positive or negative integer.

Step 15: A mask pattern is designed based on a result at Step S14.

Step 16: A mask is produced. In particular, a mask wherein the mask pattern is formed on a transparent substrate is produced.

Step 17: The mask produced at Step 16 is used to perform transfer, development and etching to produce a lens.

Step 18: The height of the surface of the produced lens is measured and an error of the measured height from the design value is checked. In particular, where $\Delta Z$ represents a surface shape error and $\Delta Z(r)$ represents the surface shape error at each radius, $\Delta Z=\Delta Z(r)$ is checked.

Step 19: From the measured error, a correction value to the desired lens shape with respect to the design value is calculated in accordance with an expression $Z'(r)=Z(r)-\Delta Z(r)$, and this is fed back to the target shape. In particular, the lens shape $Z(r)$ is set to $Z(r)=Z'(r)$, and the processing returns to Step 11, at which pattern designing is performed. In this instance, there is no necessity to acquire the calibration data again at Step 12.

Every time the correction at Steps 11 to 19 is performed in a loop, the surface accuracy is raised. Consequently, correction with the transmission factor error by a mutual interference effect with an adjacent opening taken into consideration can be achieved, and improvement of the final surface accuracy can be achieved.

Figure 10:
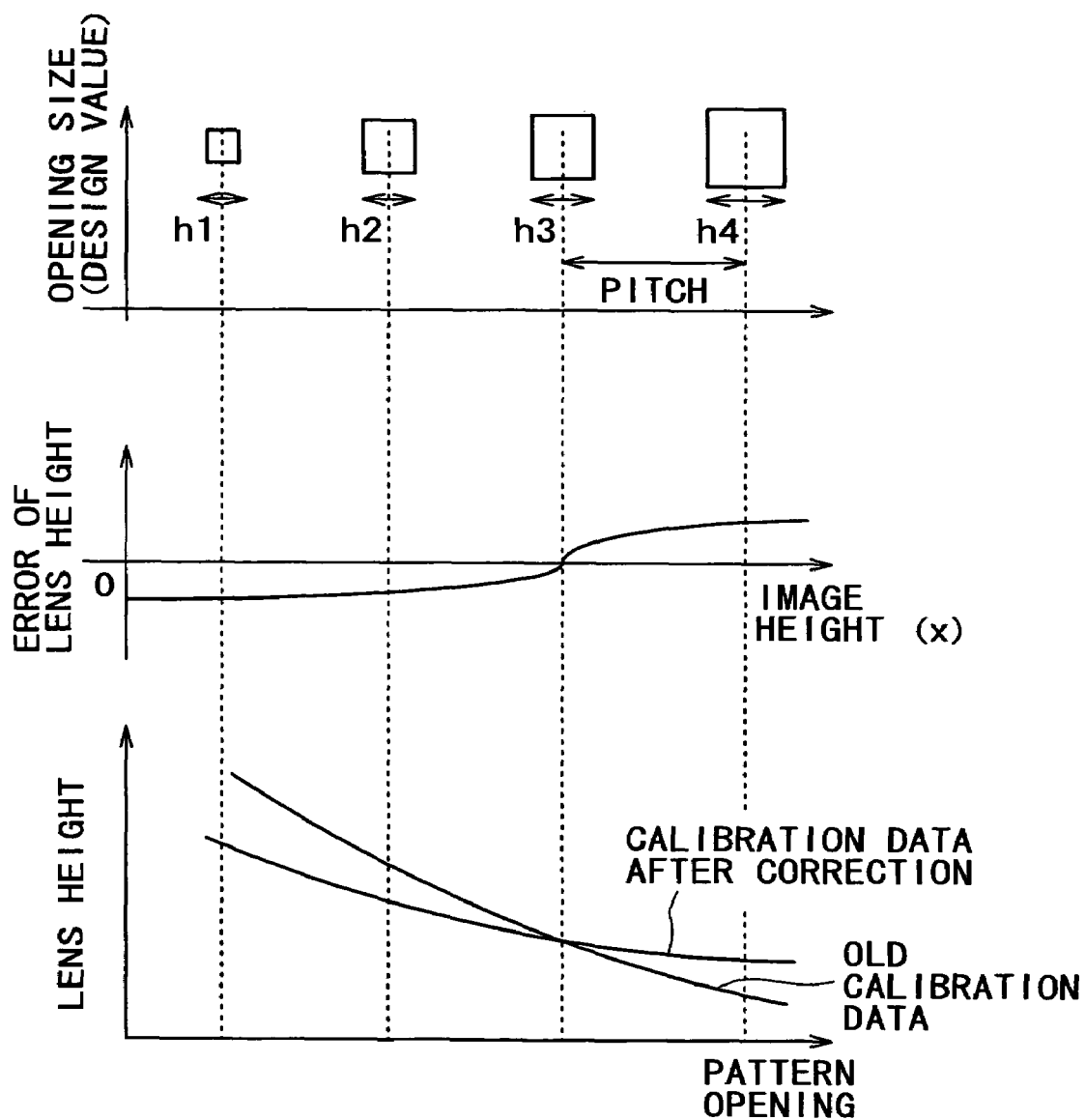
FIG. 10 is a schematic diagrammatic view illustrating an example wherein correction by an error is caused to reflect on the dimension of an opening.
Figure 11:
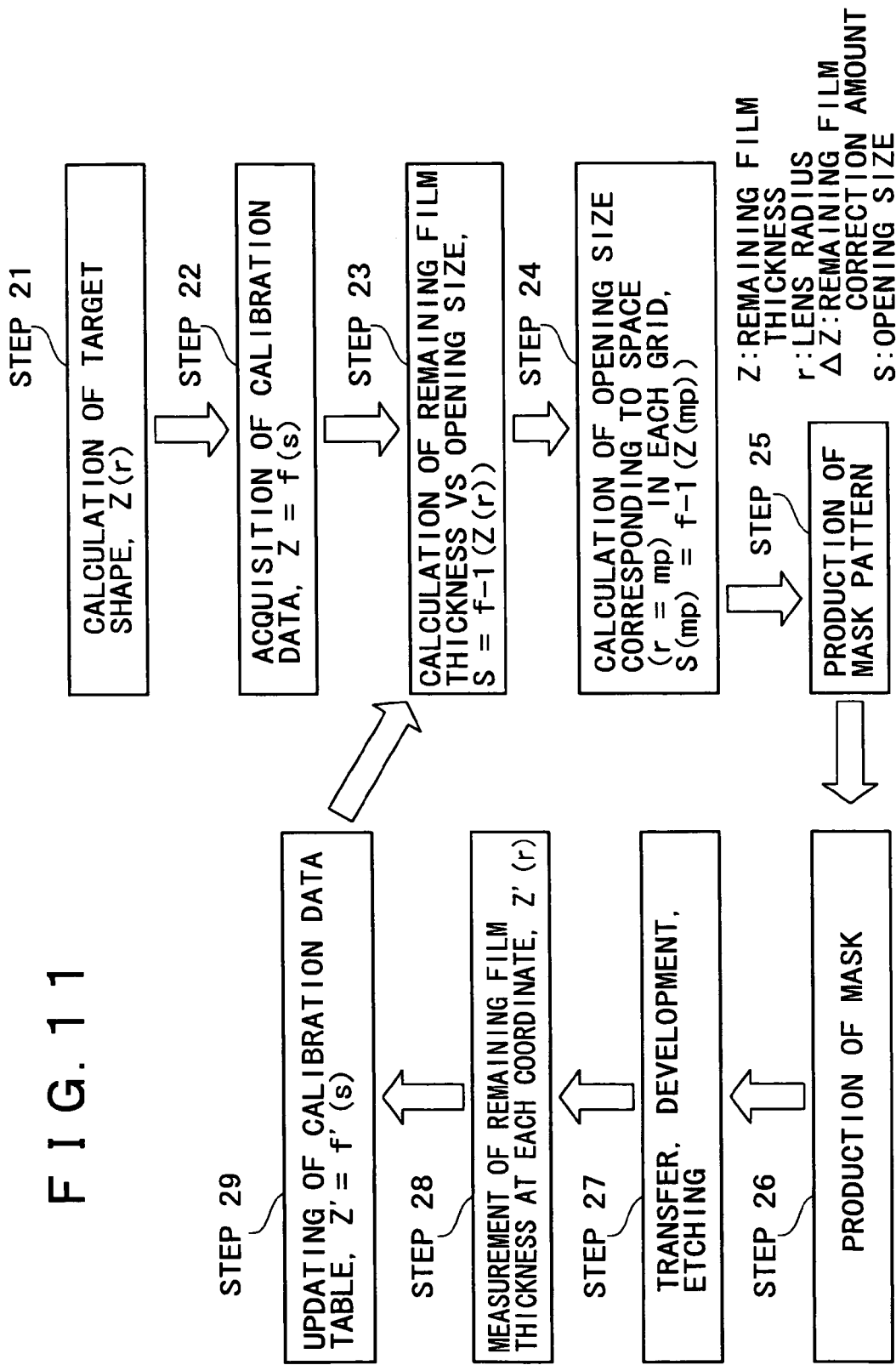
FIG. 11 is a flow chart illustrating another procedure of causing correction by an error to reflect on actual design of a mask pattern.

As another procedure, another method may be used wherein an error of the lens height with respect to the opening size is calculated based on design values of opening sizes (h1 to h4) and actual measurement values of the lens height as seen in FIG. 10 and the calibration data is corrected so as to cancel the error and then an opening dimension with which the predetermined target can be obtained is derived using the corrected calibration function (or table). This procedure is described with reference to FIG. 11.

Step 21: A target lens shape $Z(r)$ is defined and calculated. Here, the target lens shape is set to the lens height $Z(r)$ where r is the radius.

Step 22: Calibration data are acquired in accordance with an expression $Z=f(s)$. In particular, a relationship between the opening size and the lens height is calculated based on the calibration data. In the expression, s represents the opening size of the calibration data, and f is a function for deriving the lens height from the opening size.

Step 23: The ratio between the remaining film thickness and the opening size is calculated in accordance with an expression S=f−1(Z(r)). In particular, a relational expression of the opening size necessary for the height (remaining film thickness) of the lens is determined. In the expression, S is the opening size necessary to form the desired lens height Z(r) with respect to a certain pattern grid.

Step 24: The opening size corresponding to the space (r=mp) of each pattern grid is calculated in accordance with an expression S(mp)=f−1(Z(mp)). In the expression, S(mp) is the opening size where the center coordinate of the opening patter derived from the lens shape is represented by mp. Here, p represents the pattern pitch, and m a positive or negative integer.

Step 25: A mask pattern is designed based on a result at Step S24.

Step 26: A mask is produced. In particular, a mask wherein the mask pattern is formed on a transparent substrate is produced.

Step 27: The mask produced at Step 26 is used to perform transfer, development and etching to produce a lens.

Step 28: The produced lens surface is measured and the remaining film thickness at each coordinate is checked. Here, the lens height at the radius r is represented by Z'(r).

Step 29: The calibration data is updated based on a result at Step 28, and a relationship between the opening size and the lens height is derived again. A result of this is used so that it reflects on the steps beginning with Step S23.

Every time the correction at Steps 23 to 29 is performed in a loop, the surface accuracy is raised. Consequently, correction with the transmission factor error by a mutual interference effect with an adjacent opening taken into consideration can be achieved, and improvement of the final surface accuracy can be achieved.

FIG. 12 illustrates an example of a result of measurement of the remaining film characteristic conducted actually using the calibration mask according to the present invention. In FIG. 12, the axis of abscissa represents the hole opening size (the pitch is 0.986 μm), and the axis of ordinate represents the resist remaining film thickness after development.

Figure 13A:
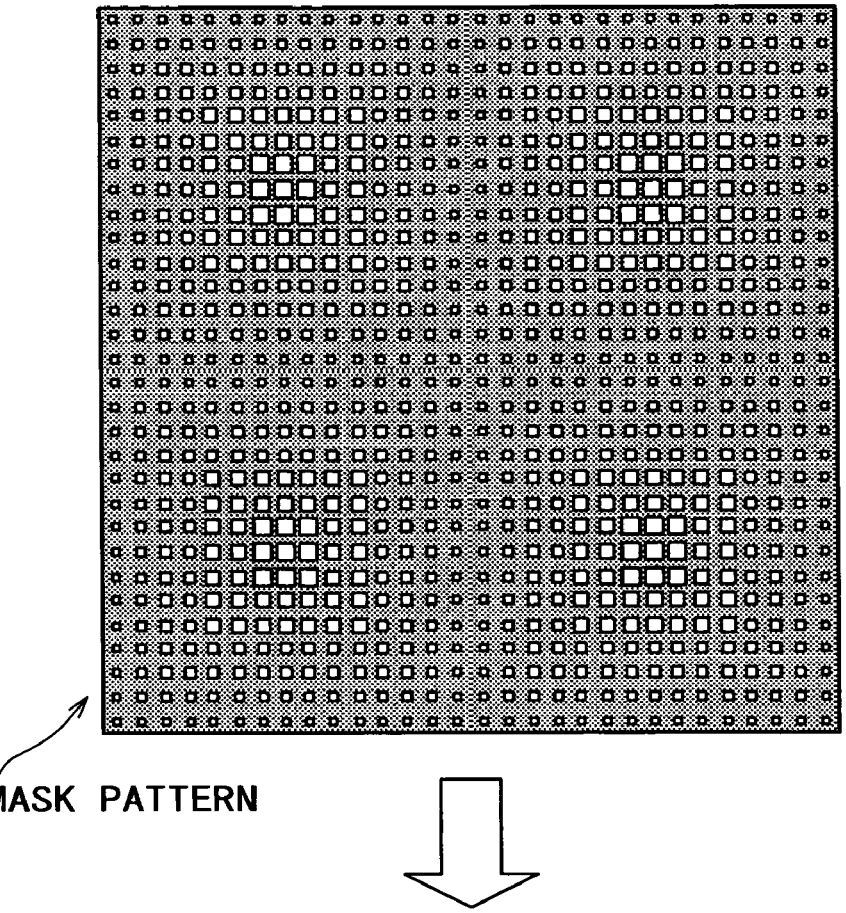
FIGS. 13A and 13B are schematic views showing an example of a mask pattern on which calibration reflects.
Figure 13B:
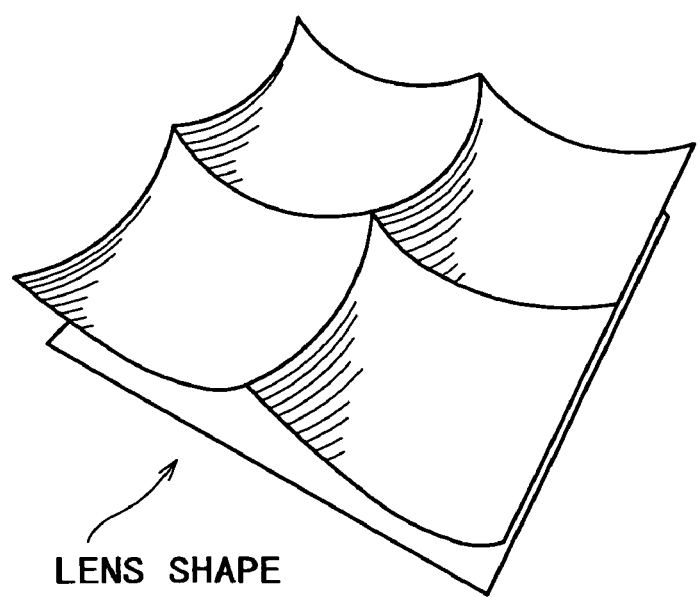
Figure 14:
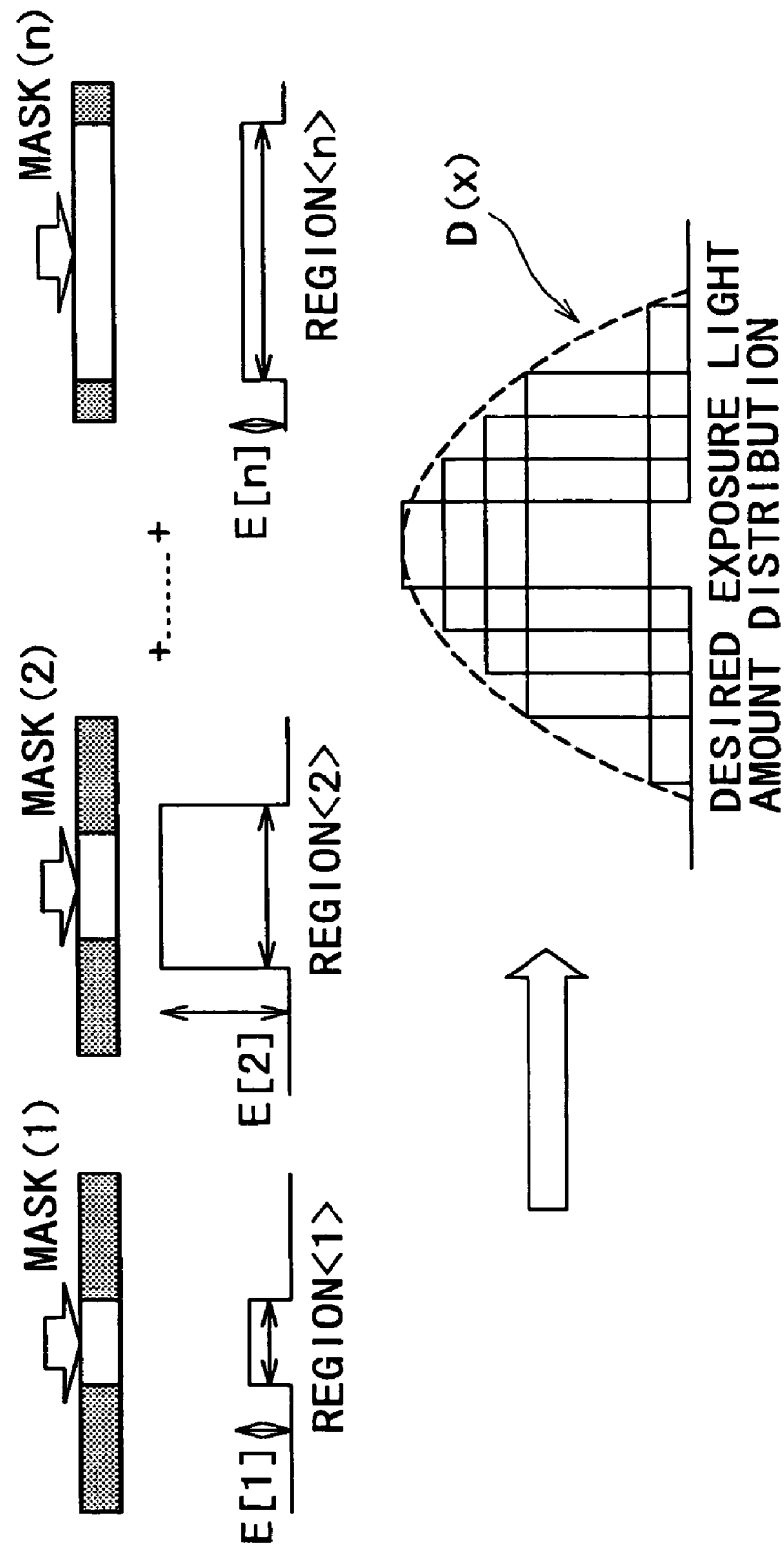
FIG. 14 is a schematic view illustrating an example of multiple exposure.
Figure 17:
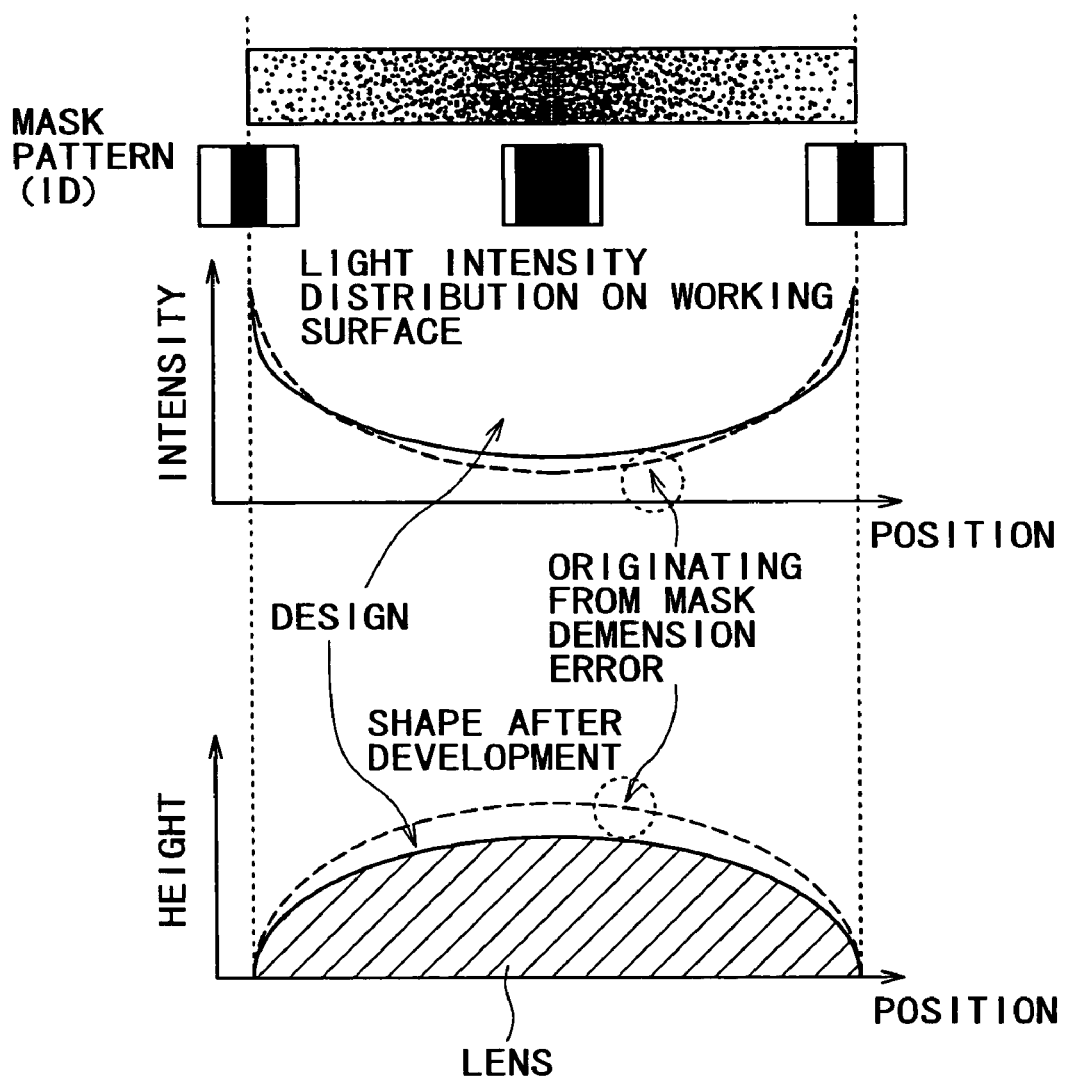
FIG. 17 is a diagrammatic view illustrating an error of the height of a shape caused by an error by production of a mask.
Figure 18:
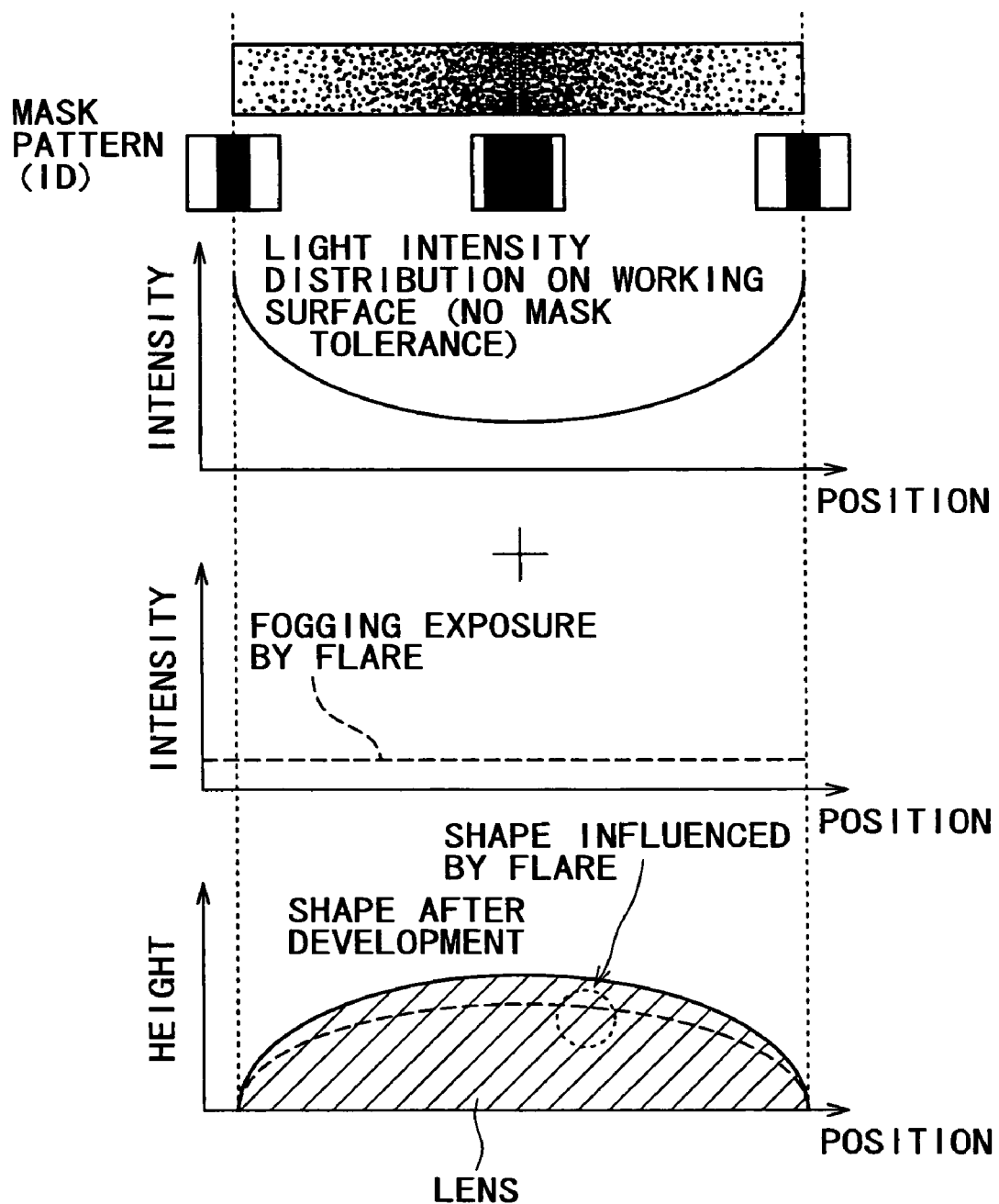
FIG. 18 is a diagrammatic view illustrating an error of the height of a shape by flare.

FIGS. 13A and 13B show an example of a mask pattern on which the correction described above reflects. Particularly, FIG. 13A shows a pattern for formation of four concave lenses. If this mask pattern is used to perform exposure of resist, then the shape after the development is such as shown in FIG. 13B.

Since the correction described above changes if the relationship in size of lens shapes to be formed, that is, adjacent openings to be formed, the exposure condition or the like changes, it is necessary to determine various correction amounts which depend upon the lens shape, exposure condition and so forth. On the other hand, when a mask pattern is to be designed in the same lens shape, exposure condition or the like, if data obtained by correcting data once, that is, such a relationship between the opening size and the resist remaining film thickness as illustrated in FIG. 12, is used, then a master pattern on which the correction amount reflects can be designed without actually performing measurement.

It is to be noted that the present invention can be applied not only to design and production of a mask for production of a microlens array described hereinabove but also to design and production of a mask for formation of any other three-dimensional shape.

While a preferred embodiment of the present invention has been described using specific terms, such description is for illustrative purpose only, and it is to be understood that changes and variations may be made without departing from the spirit or scope of the following claims.

What is claimed is:

1. An exposure mask having:
   a block area having a plurality of pattern sites;
   light intercepting patterns in the plurality of pattern sites which intercept illumination light emitted from an exposure apparatus; and
   light transmitting patterns in the plurality of pattern sites which transmit the illumination light therethrough;
   wherein,
   the light intercepting patterns and light transmitting patterns have an equal ratio and an equal pitch relative to each other.

2. The exposure mask according to claim 1, wherein the block area has a plurality of block areas disposed such that the plurality of pattern sites thereof are arranged in a matrix, and between adjacent ones of the plurality of pattern sites in adjacent ones of the block areas, the ratios between the light intercepting patterns and the light transmitting patterns are equal while the pitch varies gradually.

3. The exposure mask according to claim 1, wherein the pitches of the light intercepting patterns and the light transmitting patterns in the pattern sites are such that only 0th order light arrives at an image formation plane through the plurality of pattern sites.

4. The exposure mask according to claim 1, wherein the pitches of the light intercepting patterns and the light transmitting patterns of the plurality pattern sites are represented by P as represented by an equivalent on an image formation plane, the exposure light wavelength of said exposure apparatus by $\lambda$, the numerical aperture of said exposure apparatus by NA, the coherence factor representing the size of a secondary light source by o, and a relationship $$P < \lambda/\{NA \times (1+\sigma)\}$$

is satisfied.

5. The exposure mask according to claim 1, wherein a light source including a plurality of spectra is used as a light source of said exposure apparatus, where the shortest spectrum wavelength is represented by $\lambda o$, the pitches of the light intercepting patterns and the light transmitting patterns of the plurality of pattern sites by P as represented by an equivalent on an image formation plane, the numerical aperture of said exposure apparatus by NA, the coherence factor representing the size of a secondary light source by $\sigma$, and a relationship $$P < \lambda o/\{NA \times (1+\sigma)\}$$

is satisfied.

6. The exposure mask according to claim 1, wherein each of the light intercepting patterns and the light transmitting patterns are formed from a straight line in each of the plurality of pattern sites.

7. The exposure mask according to claim 1, wherein each of the plurality of pattern sites is formed as of a through-hole type or an island type from the light intercepting patterns and the light transmitting patterns.

8. The exposure mask according to claim 1, wherein the plurality of pattern sites which form the block area are disposed such that the pitches of the light intercepting patterns and the light transmitting patterns are equal while the ratio varies gradually.

9. A method of producing a mask pattern, comprising the steps of:
   exposing a photosensitive material using an exposure mask having a block area in which a plurality of pattern sites are formed with each having light intercepting patterns to intercept illumination light emitted from an exposure apparatus and light transmitting patterns to transmit the illumination light therethrough, the light intercepting patterns and light transmitting patterns disposed at an equal ratio and an equal pitch relative to each other as a calibration mask;

developing the photosensitive material after the exposure;

performing a process for the photosensitive material after the development to form a measurement object;

measuring the height of the measurement object corresponding to the block areas to determine a height of the measurement object; and setting ratios of the light intercepting patterns and the light transmitting patterns to obtain a desired three-dimensional shape based on measured values of the height of the measurement object and disposing the light intercepting patterns and the light transmitting patterns at the set ratios on a transparent substrate.

10. The method of producing a mask pattern according to claim 9, wherein the pitches of the light intercepting patterns and the light transmitting patterns of the pattern sites are represented by P as represented by an equivalent on an image formation plane, the exposure light wavelength of said exposure apparatus by $\lambda$, the numerical aperture of said exposure apparatus by NA, the coherence factor representing the size of a secondary light source by $\sigma$, and a relationship $$P<\lambda/\{NA\times(1+\sigma)\}$$

is satisfied.

11. The method of producing a mask pattern according to claim 9, wherein, when a light source including a plurality of spectra is used as a light source of said exposure apparatus, where the shortest spectrum wavelength is represented by $\lambda o$, the pitches of the light intercepting patterns and the light transmitting patterns of the pattern sites by P as represented by an equivalent on an image formation plane, the numerical aperture of said exposure apparatus by NA, the coherence factor representing the size of a secondary light source by $\sigma$, and a relationship $$P<\lambda o/\{NA\times(1+\sigma)\}$$

is satisfied.

12. The method of producing a mask pattern according to claim 9, wherein if the pattern sites do not include a pattern site which has a pattern pitch equal to an integral submultiple of the size of a formation object structure by the exposure mask, then the pattern pitch is predicted by extrapolation in an equivalent of a mask transmission factor from data of the relationship between space dimension or hole dimension and the remaining film height at one of the pattern sites which has a pitch closest to the integral multiple of the size of the formation object structure by the exposure mask, and ratios of the light intercepting patterns and the light transmitting patterns for obtaining a desired three-dimensional structure are set based on the predicted pattern pitch and then the light intercepting patterns and the light transmitting patterns are disposed on the transparent substrate based on the set ratios.

13. The method of producing a mask pattern according to claim 9, further comprising the steps of:

performing exposure using the light intercepting patterns and the light transmitting patterns disposed on the transparent substrate to form a three-dimensional shape;

measuring the height of the three-dimensional shape to define a height of the three-dimensional shape;

defining errors between measured values of the height of the three-dimensional shape and corresponding values of the height of a target three-dimensional shape and correcting a definition expression for the desired three-dimensional shape based on the definition; and designing the ratios of the light intercepting patterns and the light transmitting patterns again using the definition expression after the correction.

14. The method of producing a mask pattern according to claim 9, further comprising the steps of:

performing exposure using the light intercepting patterns and the light transmitting patterns disposed on the transparent substrate to form a three-dimensional shape;

measuring the height of the three-dimensional shape to define a height of the three-dimensional shape;

defining errors between measured values of the height of the three-dimensional shape and corresponding values of the height of a target three-dimensional shape and correcting a relationship between the ratio of the light intercepting pattern and the light transmitting pattern of a calibration data and the remaining film height after the development of the photosensitive material based on the definition; and setting the ratios of the light intercepting patterns and the light transmitting patterns to obtain the desired three-dimensional shape via the calibration data after the correction and disposing the light intercepting patterns and the light transmitting patterns on the transparent substrate based on the re-set ratios and pitches.

* * * * *